United States Patent
Park et al.

(10) Patent No.: US 11,329,263 B2
(45) Date of Patent: May 10, 2022

(54) DISPLAY DEVICE AND METHOD OF MANUFACTURING THE SAME

(71) Applicant: Samsung Display Co., Ltd., Yongin-si (KR)

(72) Inventors: Soon-Sung Park, Asan-si (KR);
Do-Hyeon Kim, Asan-si (KR);
Jeongjin Kim, Cheonan-si (KR);
Jungchul Woo, Seoul (KR);
Moo-Hyun Jo, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 118 days.

(21) Appl. No.: 16/773,682

(22) Filed: Jan. 27, 2020

(65) Prior Publication Data
US 2020/0259127 A1    Aug. 13, 2020

(30) Foreign Application Priority Data

Feb. 13, 2019    (KR) .......................... 10-2019-0016445

(51) Int. Cl.
*H05K 1/11*        (2006.01)
*G02F 1/1333*      (2006.01)
(Continued)

(52) U.S. Cl.
CPC ............ *H01L 51/56* (2013.01); *G06F 1/1652* (2013.01); *H01L 51/0097* (2013.01);
(Continued)

(58) Field of Classification Search
CPC . H01L 51/56; H01L 51/0097; H01L 51/5237; H01L 2251/5338; H01L 51/5253;
(Continued)

(56) References Cited

U.S. PATENT DOCUMENTS 7,365,821 B2 *    4/2008    Dewa .................. G02F 1/13452
                                                        349/150
9,583,448 B2      2/2017    Ahn
(Continued)

FOREIGN PATENT DOCUMENTS

CN        105976701 A      9/2016
CN        105989783 A      10/2016
(Continued)

OTHER PUBLICATIONS

Chen Xiao; Driver Interconnection Technologies for Flexible Displays; Dissertation Submitted to Shanghai Jiao Tong University for the Degree of Master; School of Electronic Information and Electrical Engineering; Jun. 2014; 100 pages (Abstract, 1 page).

(Continued)

*Primary Examiner* — Xiaoliang Chen
(74) *Attorney, Agent, or Firm* — Lewis Roca Rothgerber Christie LLP

(57) ABSTRACT

A display device includes a display module configured to display an image, and a flexible board in which a flat area and a bending area arranged in one direction in a plan view are defined, wherein at least a portion of the flat area is connected to the display module, and wherein the flexible board includes a base substrate connected to the display module, a cover member on the flat area, and covering a boundary at which the base substrate and the display module are connected to each other, and a blocking member on the flat area, and in contact with the cover member.

20 Claims, 12 Drawing Sheets

(51) Int. Cl.
| | | |
|---|---|---|
| *G02F 1/1339* | (2006.01) | |
| *G06F 3/041* | (2006.01) | |
| *G06F 3/045* | (2006.01) | |
| *H01L 51/00* | (2006.01) | |
| *H01L 51/52* | (2006.01) | |
| *H01L 51/56* | (2006.01) | |
| *G06F 1/16* | (2006.01) | |
| *H05K 5/00* | (2006.01) | |
| *H05K 1/02* | (2006.01) | |

(52) U.S. Cl.
 CPC ......... *H01L 51/5237* (2013.01); *H05K 1/028* (2013.01); *H05K 5/0017* (2013.01); *H01L 2251/5338* (2013.01)

(58) Field of Classification Search
 CPC ..... H01L 27/3244; H01L 51/00; H01L 51/52; H01L 51/5281; G06F 1/1652; G06F 1/1637; G06F 1/1658; G06F 1/1626; G06F 3/041; G06F 3/045; H05K 5/0017; H05K 1/028; H05K 2201/10128; H05K 2201/2009; H05K 1/147; H05K 1/11; Y02E 10/549; G09F 9/301; G02F 1/1333; G02F 1/1339
 USPC ......... 361/749; 174/255; 349/150, 158, 161; 257/678, 773
 See application file for complete search history.

(56) References Cited

U.S. PATENT DOCUMENTS

| | | | |
|---|---|---|---|
| 9,818,974 B2 | 11/2017 | Kwon et al. | |
| 9,933,870 B2 | 4/2018 | You et al. | |
| 9,983,714 B2 | 5/2018 | Ahn | |
| 10,048,786 B2 | 8/2018 | Ahn et al. | |
| 10,153,337 B2 | 12/2018 | Lee et al. | |
| 10,177,129 B2 | 1/2019 | Namkung et al. | |
| 10,270,059 B2 | 4/2019 | Kim | |
| 10,838,243 B2 | 11/2020 | Chung et al. | |
| 10,943,961 B2 * | 3/2021 | Kim ..................... | H05K 1/0281 |
| 2002/0027634 A1 * | 3/2002 | Kang .................... | H05K 3/361 349/150 |
| 2005/0167803 A1 * | 8/2005 | Imamura ............... | H05K 1/0281 257/678 |
| 2006/0213682 A1 * | 9/2006 | Moon .................... | H05K 1/028 174/255 |
| 2009/0015777 A1 * | 1/2009 | Nakanishi ........... | G02F 1/13452 349/150 |
| 2014/0240933 A1 | 8/2014 | Lee et al. | |
| 2014/0306348 A1 * | 10/2014 | Ahn ...................... | H05K 1/0281 257/773 |
| 2015/0163939 A1 | 6/2015 | Park | |
| 2017/0311442 A1 * | 10/2017 | Eom .................... | H05K 5/0017 |
| 2018/0046221 A1 | 2/2018 | Choi et al. | |
| 2018/0114944 A1 | 4/2018 | Son et al. | |
| 2018/0180911 A1 | 6/2018 | Odaka | |
| 2018/0182829 A1 | 6/2018 | Shin et al. | |
| 2019/0051858 A1 * | 2/2019 | Tomioka ............. | H01L 27/3276 |
| 2019/0161630 A1 * | 5/2019 | Kim ...................... | H01L 27/323 |

FOREIGN PATENT DOCUMENTS

| | | |
|---|---|---|
| CN | 106486520 A | 3/2017 |
| CN | 106887186 A | 6/2017 |
| CN | 107424519 A | 12/2017 |
| CN | 107564918 A | 1/2018 |
| CN | 107819009 A | 3/2018 |
| CN | 108054189 A | 5/2018 |
| CN | 108257508 A | 7/2018 |
| JP | 2005338699 * | 12/2005 |
| KR | 10-2017-0114906 A | 10/2017 |

OTHER PUBLICATIONS

Yu-Wei Huang, et al.; Development and Reliability of Ultra-Thin Chip on Plastic Bonding for Flexible Liquid Crystal Displays; 2010 Electronic Components and Technology Conference; pp. 576-580.

* cited by examiner ized. Thus, various
DISPLAY DEVICE AND METHOD OF MANUFACTURING THE SAME

CROSS-REFERENCE TO RELATED APPLICATION

This application claims priority to, and the benefit of, Korean Patent Application No. 10-2019-0016445, filed on Feb. 13, 2019, the entire contents of which are hereby incorporated by reference.

BACKGROUND

The present disclosure herein relates to a display device that has improved durability and that includes a flexible board having improved bending characteristics, and a method of manufacturing the same.

Recently, various display devices have been made to be thinner and lighter to thereby be miniaturized. Thus, various techniques for mounting driving elements for displaying an image in a limited area of a display device have been studied.

The driving elements for displaying an image in the display device may be mounted directly on a flexible circuit board, or the flexible circuit board may be provided in the form of a tape carrier package (TCP) for connecting a printed circuit board, on which the driving elements are mounted, to a display panel.

In a process where the flexible circuit board is repeatedly bent or where the flexible circuit board is coupled in a bent state, a crack may occur at a circuit pattern formed on the flexible circuit board, or the circuit pattern may be broken by tensile force that is generated during bending.

SUMMARY

The present disclosure may provide a display device that prevents moisture and/or oxygen from permeating between a flexible board and a display substrate, and that does not reduce bending characteristics of the flexible board, and a method of manufacturing the same.

In an embodiment of the present disclosure, a display device includes a display module configured to display an image, and a flexible board in which a flat area and a bending area arranged in one direction in a plan view are defined, wherein at least a portion of the flat area is connected to the display module, and wherein the flexible board includes a base substrate connected to the display module, a cover member on the flat area, and covering a boundary at which the base substrate and the display module are connected to each other, and a blocking member on the flat area, and in contact with the cover member.

The bending area may be bent about a bending axis, wherein the flexible board includes a bottom surface adjacent the bending axis, and a top surface opposite to the bottom surface, and wherein the cover member and the blocking member are on the bottom surface of the flexible board.

The display device may further include a cover layer contacting the display module and the top surface of the flexible board.

The display module may include a plurality of display elements configured to generate light for displaying the image, and an encapsulation layer covering the plurality of display elements, wherein the cover layer is in contact with at least a portion of the encapsulation layer.

The blocking member may include a first blocking layer on the base substrate, and a second blocking layer on the first blocking layer.

The blocking member may include a first sub-blocking member and a second sub-blocking member, which are spaced apart from each other in the one direction, wherein the cover member fills a space between the first sub-blocking member and the second sub-blocking member.

The display device may further include a printed circuit board under the display module, wherein a first flat area, the bending area, and a second flat area arranged in the one direction in a plan view are defined in the flexible board, wherein the flexible board is connected to the display module at the first flat area, and wherein the flexible board is connected to the printed circuit board at the second flat area.

The blocking member may overlap with the flat area, and may not overlap with the bending area, when viewed in a plan view.

The base substrate may include a base layer, a circuit layer on the base layer and connected to the display module, and a solder resist layer on the circuit layer, wherein the blocking member is on the solder resist layer.

The blocking member may include the same material as the solder resist layer.

The display device may further include a driving element on at least one of the flexible board or the display module.

The display module may include a display surface for displaying the image, a rear surface opposite to the display surface, and one side surface connecting the display surface and the rear surface, wherein the cover member is in contact with the one side surface.

In an embodiment of the present disclosure, a display device includes a flexible display module in which a display area for displaying an image, and a non-display area adjacent the display area, are defined, a cover member that is on the non-display area, and that does not overlap with the display area, in a plan view, and a blocking member on the non-display area, and in contact with the cover member, wherein the flexible display module includes a display surface for displaying the image, and a rear surface opposite to the display surface, and wherein the cover member and the blocking member are on the rear surface of the flexible display module.

The non-display area may include a flat area adjacent the display area, and a bending area spaced apart from the display area with the flat area interposed therebetween, and bent about a bending axis adjacent the rear surface of the flexible display module, wherein the cover member and the blocking member are on the flat area, and do not overlap with the bending area, when viewed in a plan view.

The display device may further include a support layer on the rear surface of the flexible display module, wherein the cover member is in contact with the rear surface of the flexible display module and a side surface of the support layer.

The display device may further include a printed circuit board under the flexible display module, wherein the cover member and the blocking member are spaced apart from the printed circuit board.

The non-display area may include a first flat area, a bending area, and a second flat area, which are arranged in one direction in a plan view, wherein the cover member and the blocking member are on the first flat area, and wherein the second flat area is connected to the printed circuit board.

In an embodiment of the present disclosure, a method of manufacturing a display device includes preparing a display module configured to display an image, preparing a flexible board in which a blocking member is formed on a base substrate, bonding an end of the flexible board to one edge portion of the display module, forming a cover member contacting a side surface of the one edge portion of the display module connected to the flexible board, and bending the flexible board, wherein the cover member is formed in an area between the blocking member and the side surface of the one edge portion of the display module.

A bending axis may be adjacent a surface of the base substrate on which the blocking member is formed, wherein the flexible board is bent about the bending axis in the bending of the flexible board.

The flexible board may include a bending area bent about the bending axis, and a flat area adjacent the bending area, wherein the blocking member and the cover member are on the flat area.

BRIEF DESCRIPTION OF THE DRAWINGS

The accompanying drawings are included to provide a further understanding of embodiments of the present disclosure, and are incorporated in, and constitute a part of, this specification. The drawings illustrate embodiments of the present disclosure and, together with the description, serve to explain aspects of embodiments of the present disclosure. In the drawings.

DETAILED DESCRIPTION

Figure 1:
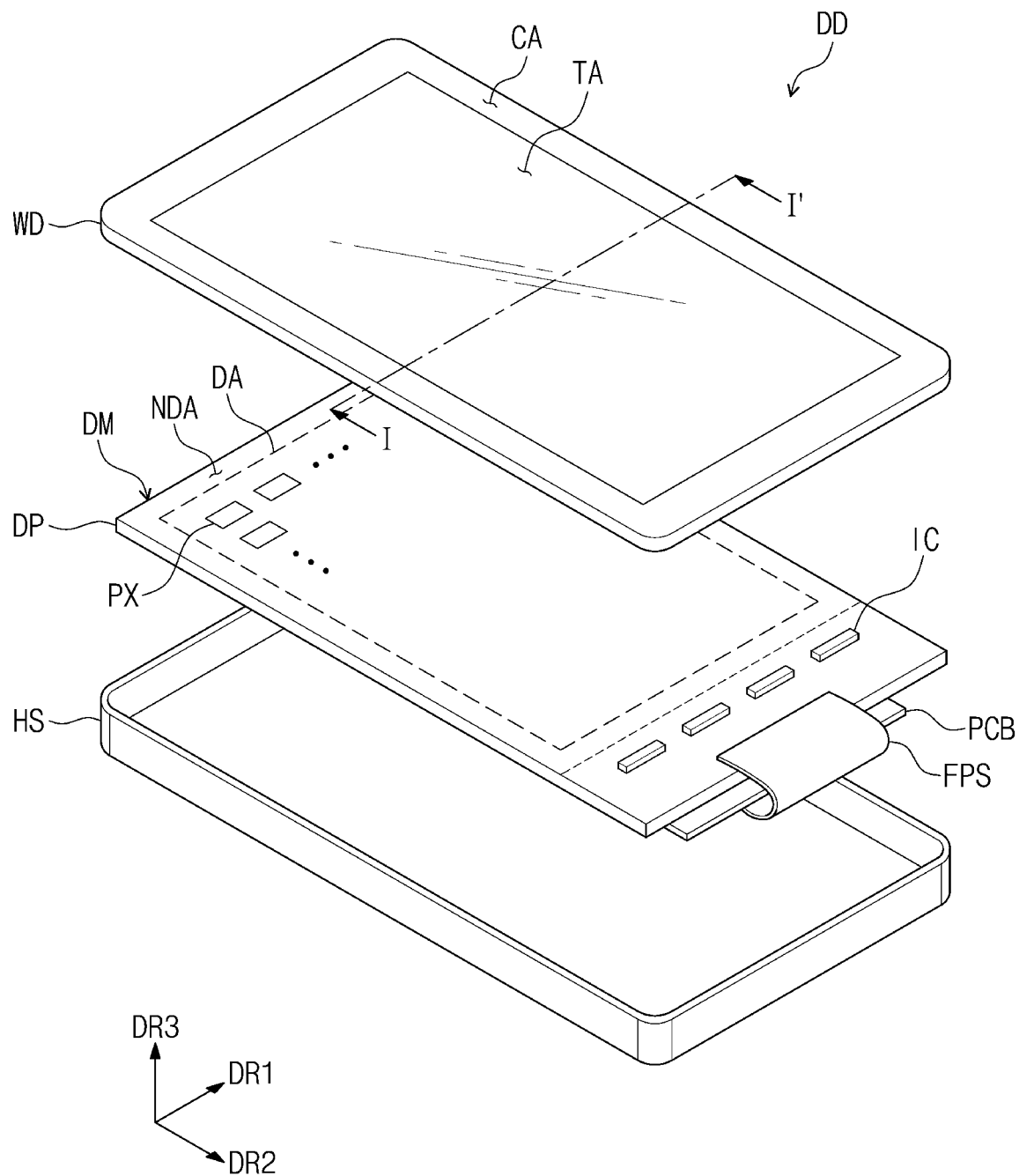
FIG. 1 is an exploded perspective view illustrating a display device according to an embodiment of the present disclosure.

Embodiments of the present disclosure now will be described more fully hereinafter with reference to the accompanying drawings, in which various embodiments are shown. The embodiments may, however, be embodied in many different forms, and should not be construed as limited to the embodiments set forth herein. Rather, these embodiments are provided so that this disclosure will be thorough and complete, and will fully convey the scopes of embodiments of the present disclosure to those skilled in the art. Like reference numerals refer to like elements throughout.

It will be understood that when an element such as a layer, region or substrate is referred to as being "on" another element, it can be directly on the other element or intervening elements may be present. In contrast, the term "directly" means that there are no intervening elements. As used herein, the term "and/or" includes any and all combinations of one or more of the associated listed items.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, as an example, the term "below" can encompass both an orientation of above and below. The device may be otherwise oriented (rotated 90 degrees or at other orientations) and the spatially relative descriptors used herein interpreted accordingly.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Embodiments are described herein with reference to cross-sectional illustrations and/or plane illustrations that may be idealized exemplary illustrations. In the drawings, the thicknesses of layers and regions are exaggerated for clarity. Accordingly, variations from the shapes of the illustrations as a result, for example, of manufacturing techniques and/or tolerances, are to be expected. Thus, embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of embodiments.

Display devices according to embodiments of the present disclosure will be described hereinafter with reference to the drawings.

Figure 2:
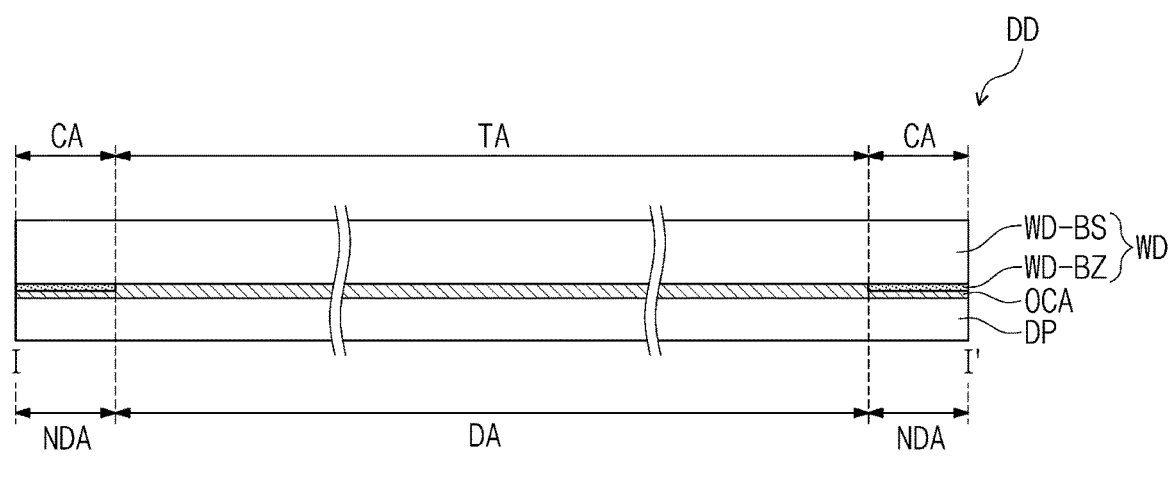
FIG. 2 is a cross-sectional view taken along the line I-I' of FIG. 1.
Figure 2:
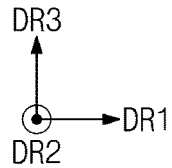

FIG. 1 is an exploded perspective view illustrating a display device according to an embodiment of the present disclosure, and FIG. 2 is a cross-sectional view taken along the line I-I' of FIG. 1. FIG. 2 illustrates a cross section defined by a first direction DR1 and a third direction DR3. FIG. 2 simply illustrates a display device DD for describing stack relation of a functional panel and/or units of the display device DD. A housing HS, a printed circuit board PCB, and a flexible board FPS are omitted in FIG. 2.

Referring to FIGS. 1 and 2, a display device DD according to an embodiment of the present disclosure may have a rectangular shape that has a short side in a first direction DR1, and a long side in a second direction DR2 that is perpendicular to the first direction DR1. However, this is illustrated as an example for the purpose of ease and convenience in description, and the shape of the display device DD is not limited thereto.

The display device DD may provide a display surface that is parallel to the first and second directions DR1 and DR2, and that displays an image in the third direction DR3. The display surface on which an image is displayed may correspond to a front surface of the display device DD.

A normal direction of the display surface (i.e., the direction in which an image is displayed) may be indicated by the third direction DR3. Hereinafter, a front surface (or a top surface) and a rear surface (or a bottom surface) of each of layers or units may be defined by the third direction DR3. However, the first to third directions DR1, DR2, and DR3 illustrated in the present embodiment may be relative concepts, and may be changed into other directions in other embodiments. Hereinafter, first to third directions are indicated by the same reference designators as the first to third directions DR1, DR2, and DR3, respectively.

The display device DD may include a window member WD, a display module DM, a printed circuit board PCB, a flexible board FPS, and a housing HS. The display module DM and the window member WD may be coupled to each other by an optical clear adhesive member OCA.

The window member WD may include a transparent area TA configured to transmit an image provided from the display module DM, and a light blocking area CA that is adjacent the transparent area TA. An image may not be transmitted through the light blocking area CA. The transparent area TA may be defined in a central portion of the display device DD when viewed in a plan view defined by the first direction DR1 and the second direction DR2. The transparent area TA may be an area through which an image is transmitted. A user may view an image through the transparent area TA.

The light blocking area CA may be defined around the transparent area TA, and may have a frame shape surrounding the transparent area TA. The light blocking area CA may be colored (e.g., may have a predetermined color). A shape of the transparent area TA may be substantially defined by the light blocking area CA. However, embodiments of the present disclosure are not limited thereto. In another embodiment, there may be only the transparent area TA defined in the window member WD, and the light blocking area CA may be omitted therefrom. In other words, an image may be transmitted through an entirety of a top surface/front surface of the display device DD.

As shown in FIG. 2, the window member WD may include a base film WD-BS and a light blocking pattern WD-BZ. The base film WD-BS may include a glass substrate and/or a synthetic resin film. The base film WD-BS according to an embodiment of the present disclosure is not limited to a single layer. For example, the base film WD-BS may include two or more films coupled to each other by an adhesive member.

The light blocking pattern WD-BZ may overlap with the light blocking area CA. The light blocking pattern WD-BZ may be a colored organic layer. For example, the light blocking pattern WD-BZ may be formed by a coating method.

In some embodiments, the window member WD may further include a functional coating layer located on a front surface of the base film WD-BS. The functional coating layer may include at least one of an anti-fingerprint layer, an anti-reflection layer, or a hard coating layer.

The display module DM may be located under the window member WD. In the present embodiment, the display module DM may include a display panel DP. In FIG. 2, the display panel DP is illustrated as the display module DM of FIG. 1.

Figure 4:
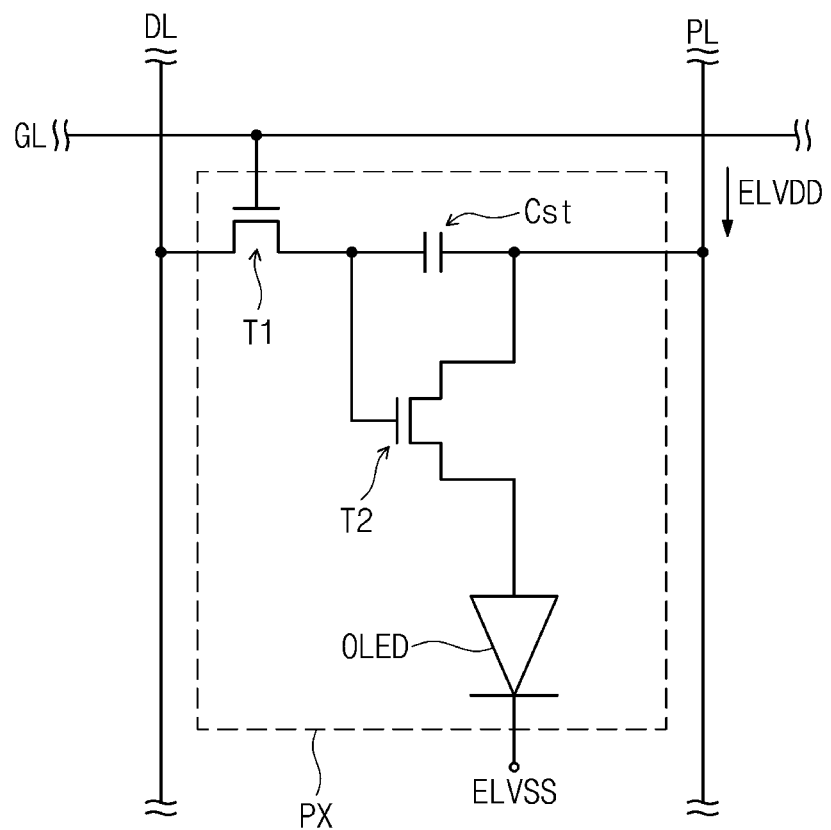
FIG. 4 is an equivalent circuit diagram of a pixel according to an embodiment of the present disclosure.

According to an embodiment of the present disclosure, the display panel DP may be an organic electro luminescence display panel (or an organic light emitting display panel). For example, the display panel DP may include a plurality of organic light emitting elements (e.g., organic light emitting diodes (OLEDs), as can be seen in FIG. 4). However, embodiments of the present disclosure are not limited to the type of the display panel DP. In certain embodiments, the display panel DP may be a liquid crystal display panel, an electrowetting display panel, a nano-crystal display panel, or a quantum-dot light emitting display panel.

A display area DA and a non-display area NDA may be defined in the display panel DP when viewed in a plan view. The display area DA may correspond to the transparent area TA of the window member WD.

The display area DA may display an image. For example, the display panel DP may include a plurality of pixels PX that are located in the display area DA and that are configured to display lights generating an image. The pixels PX may be arranged in a matrix form in the display area DA. Each of the pixels PX may display light by an electrical signal.

The non-display area NDA may have a frame shape surrounding the display area DA. The non-display area NDA may correspond to the light blocking area CA of the window member WD. The non-display area NDA may include a pad area PAD (see FIG. 3) defined in an edge area of the non-display area NDA. The pad area PAD may be connected to the printed circuit board PCB. The display panel DP may be electrically connected to an external element or component through the pad area PAD. This will be described later in more detail with reference to FIG. 3.

The printed circuit board PCB may be located under the display module DM. In FIG. 1, driving elements IC are mounted on the non-display area NDA of the display panel DP. However, embodiments of the present disclosure are not limited thereto. In another embodiment, the driving elements IC may be mounted on the printed circuit board PCB. In still another embodiment, the driving elements IC may be mounted on the flexible board FPS to be described later in detail. The driving elements IC may drive the display module DM. In an embodiment, the printed circuit board PCB may be omitted.

The flexible board FPS may connect the display module DM and the printed circuit board PCB. The flexible board FPS may electrically connect the display module DM and the printed circuit board PCB. In detail, one end of the flexible board FPS may be connected to the display module DM, and another end of the flexible board FPS may be connected to the printed circuit board PCB. At least a portion of the flexible board FPS may have bending characteristics.

In the present embodiment, one flexible board FPS is described as an example. However, embodiments of the present disclosure are not limited to the number of the flexible board FPS. In certain embodiments, a plurality of the flexible boards FPS may connect the display module DM and the printed circuit board PCB.

The housing HS may be located at a lowermost position of the display device DD, and may be coupled to the window member WD to receive the display module DM, the printed circuit board PCB, and the flexible board FPS. The housing HS may include plastic or metal. In other embodiments, the housing HS may be omitted.

Figure 3:
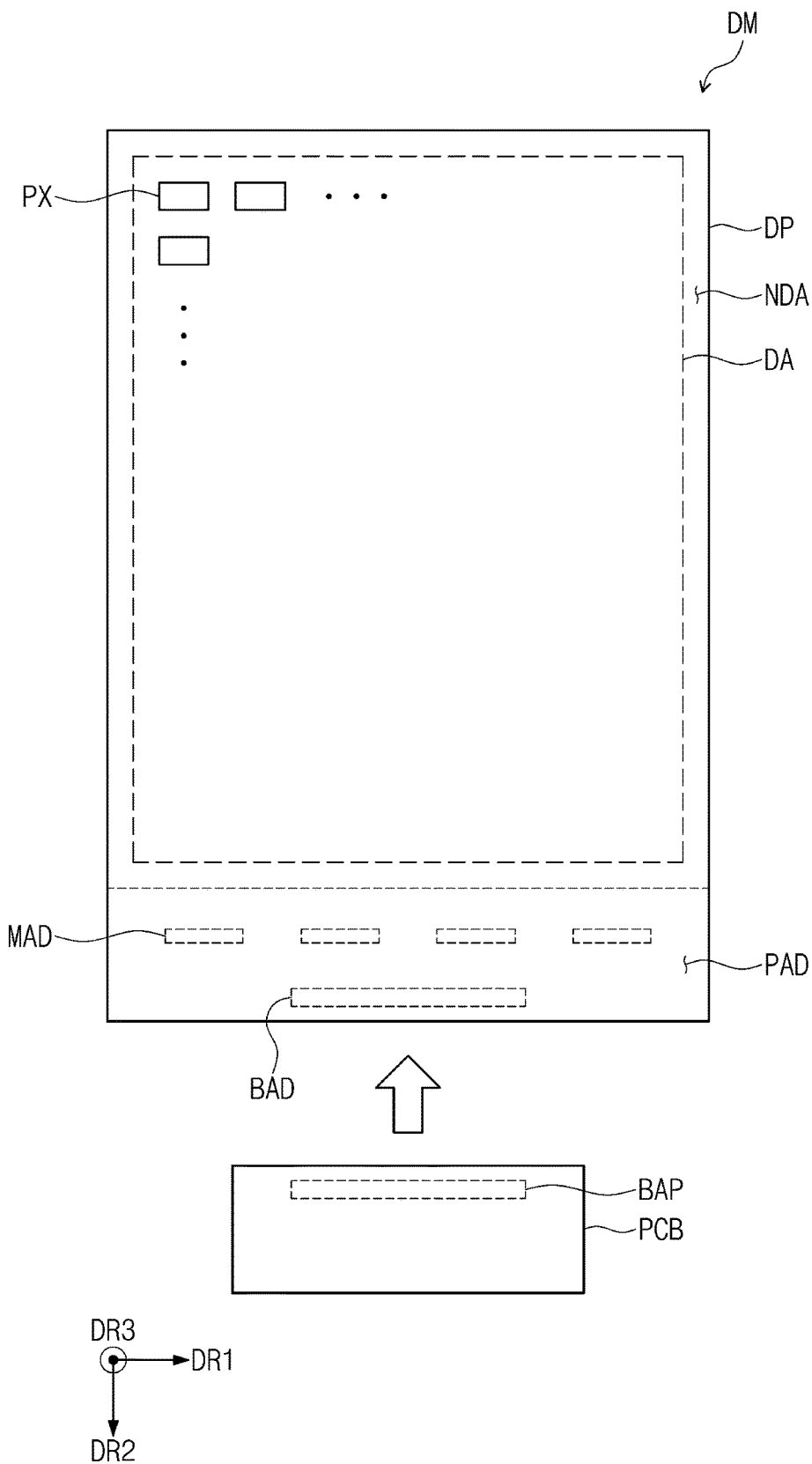
FIG. 3 is a plan view illustrating a display module and a printed circuit board according to an embodiment of the present disclosure.

FIG. 3 is a plan view illustrating a display module and a printed circuit board according to an embodiment of the present disclosure.

Referring to FIG. 3, as described above, the non-display area NDA of the display panel DP may include the pad area PAD defined in one edge area of the non-display area NDA in the second direction DR2. In some embodiments, a plurality of signal lines may be formed in the pad area PAD. The pad area PAD may include at least one mounting area MAD on which the driving element IC (see FIG. 1) is mounted, and a panel pad area BAD to which the flexible board FPS (see FIG. 1) is connected. The display panel DP may be electrically connected to an external element or component through the mounting area MAD and the panel pad area BAD. In some embodiments, a plurality of pad electrodes may be formed in the mounting area MAD and the panel pad area BAD.

A board pad area BAP may be defined in the printed circuit board PCB. The flexible board FPS (see FIG. 1) may be connected to the board pad area BAP. The printed circuit board PCB may be electrically connected to the display panel DP through the board pad area BAP. In some embodiments, a plurality of pad electrodes may be formed in the board pad area BAP. In addition, when the driving elements are mounted on the printed circuit board PCB as described above, a mounting area may be additionally defined in the printed circuit board PCB.

FIG. 4 is an equivalent circuit diagram of a pixel according to an embodiment of the present disclosure.

For the purpose of ease and convenience in description and illustration, FIG. 4 illustrates an equivalent circuit diagram of one of the plurality of pixels PX illustrated in FIGS. 1 and 3. Each of the plurality of pixels PX may have a structure corresponding to the pixel PX of FIG. 4. However, the configuration of the pixel PX is not limited to FIG. 4, but instead may be variously modified.

Referring to FIG. 4, the pixel PX may include a first transistor (or a switching transistor) T1, a second transistor (or a driving transistor) T2, and a capacitor Cst, which collectively constitute a pixel driving circuit for driving an organic light emitting diode OLED. A first power source voltage ELVDD may be provided to the second transistor T2, and a second power source voltage ELVSS may be provided to the organic light emitting diode OLED. The second power source voltage ELVSS may be lower than the first power source voltage ELVDD.

The first transistor T1 may output a data signal that is applied to a data line DL in response to a scan signal that is applied to a scan line GL. The capacitor Cst may be charged with a voltage corresponding to the data signal received from the first transistor T1. The second transistor T2 may be connected to the organic light emitting diode OLED. The second transistor T2 may control a driving current flowing through the organic light emitting diode OLED in response to the amount of charges stored in the capacitor Cst.

The equivalent circuit is illustrated as an example of the pixel PX, and embodiments of the present disclosure are not limited thereto. The pixel PX may further include one or more other transistors and/or may include two or more capacitors. In another embodiment, the organic light emitting diode OLED may be connected between a power line PL and the second transistor T2.

Figure 5:
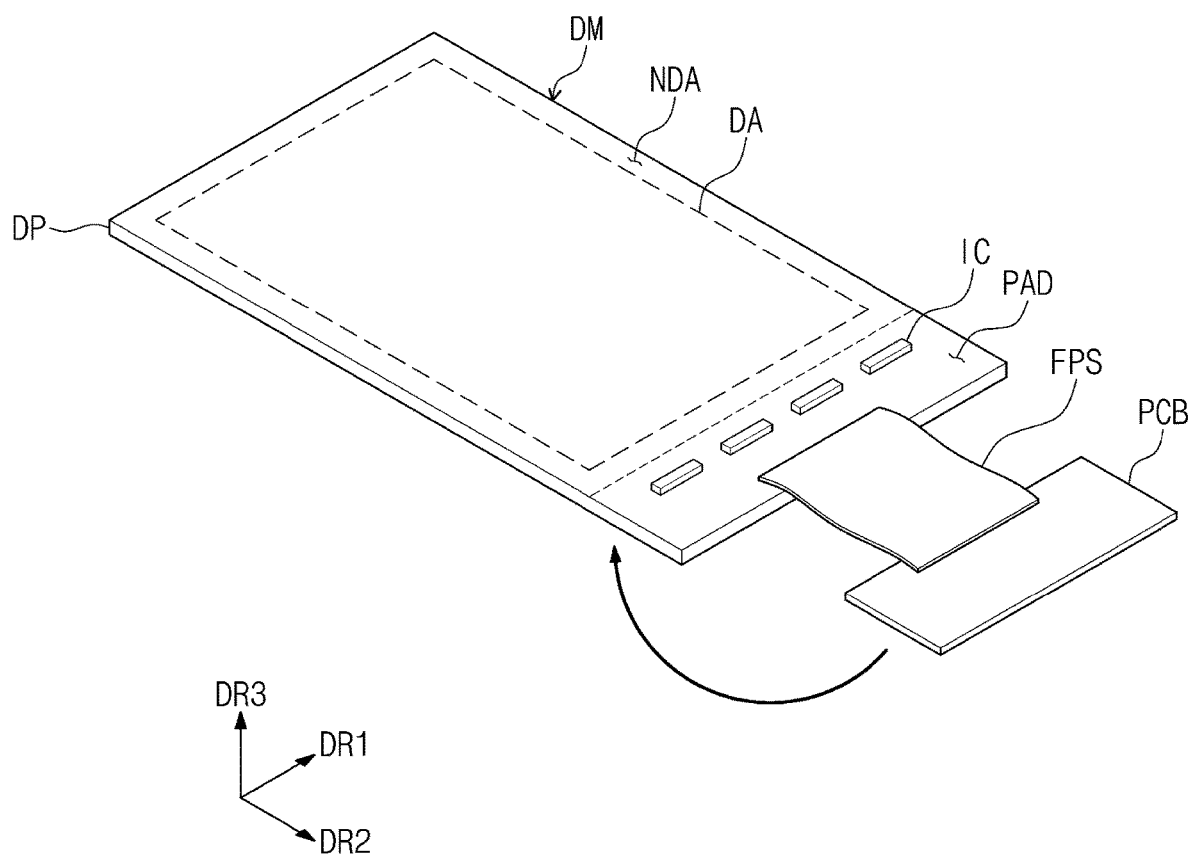
FIG. 5 is a perspective view illustrating a display module and a printed circuit board according to an embodiment of the present disclosure.
Figure 6:
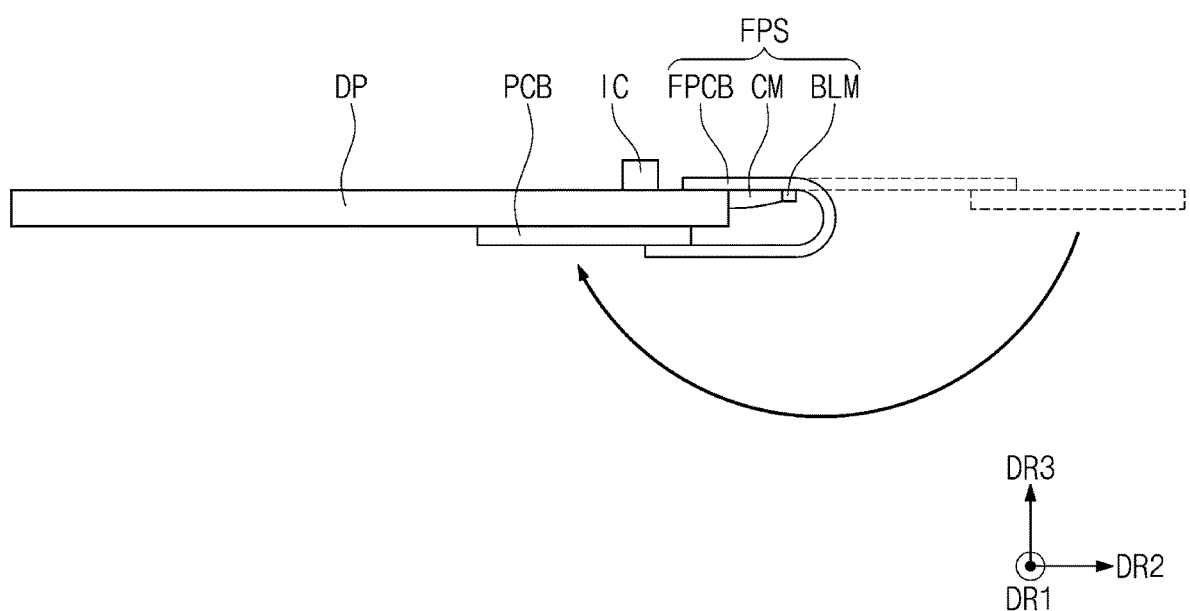
FIG. 6 is a cross-sectional view illustrating a display module and a printed circuit board according to an embodiment of the present disclosure.
Figure 7:
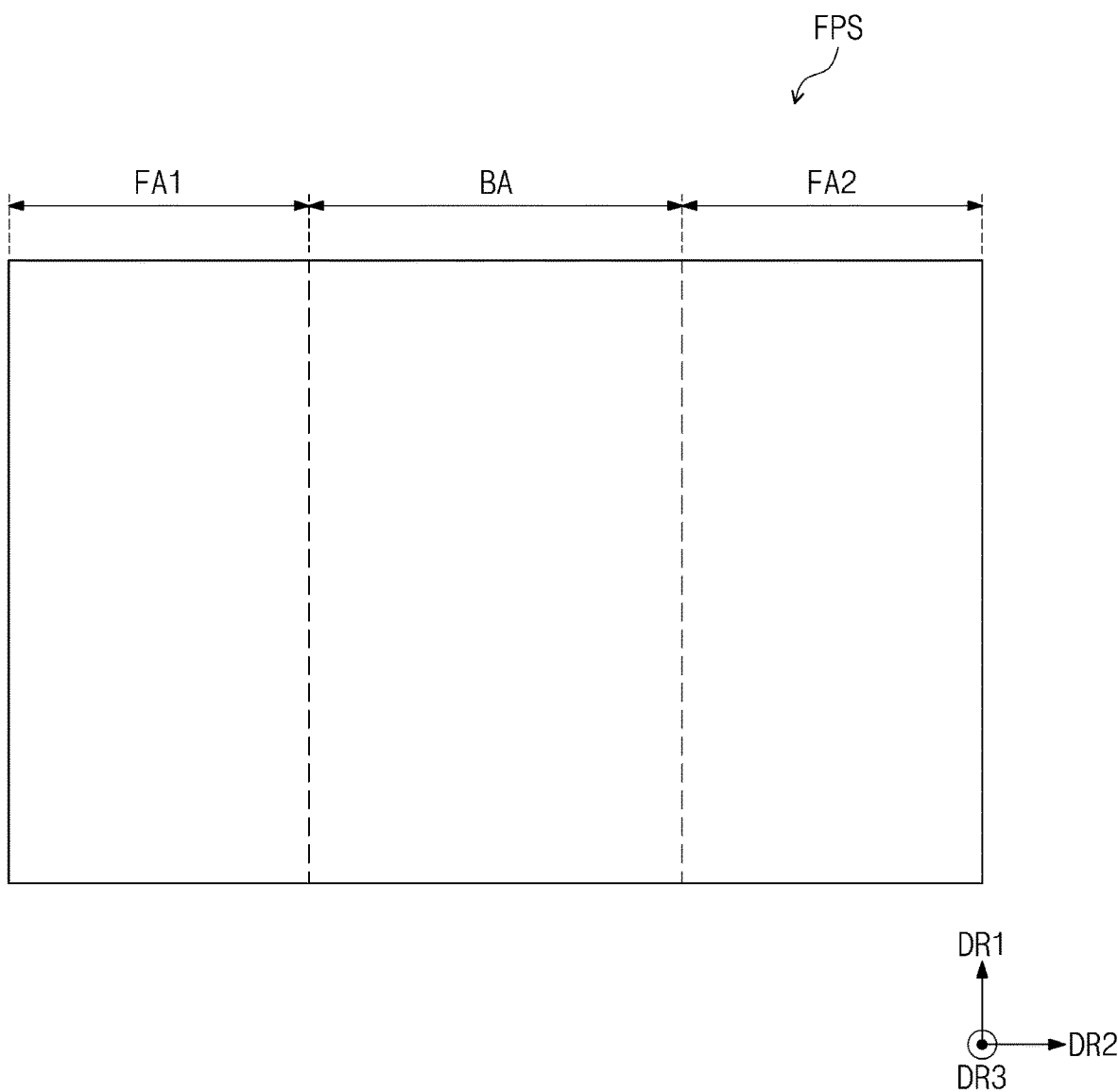
FIG. 7 is a plan view illustrating a flexible board according to an embodiment of the present disclosure.
Figure 8:
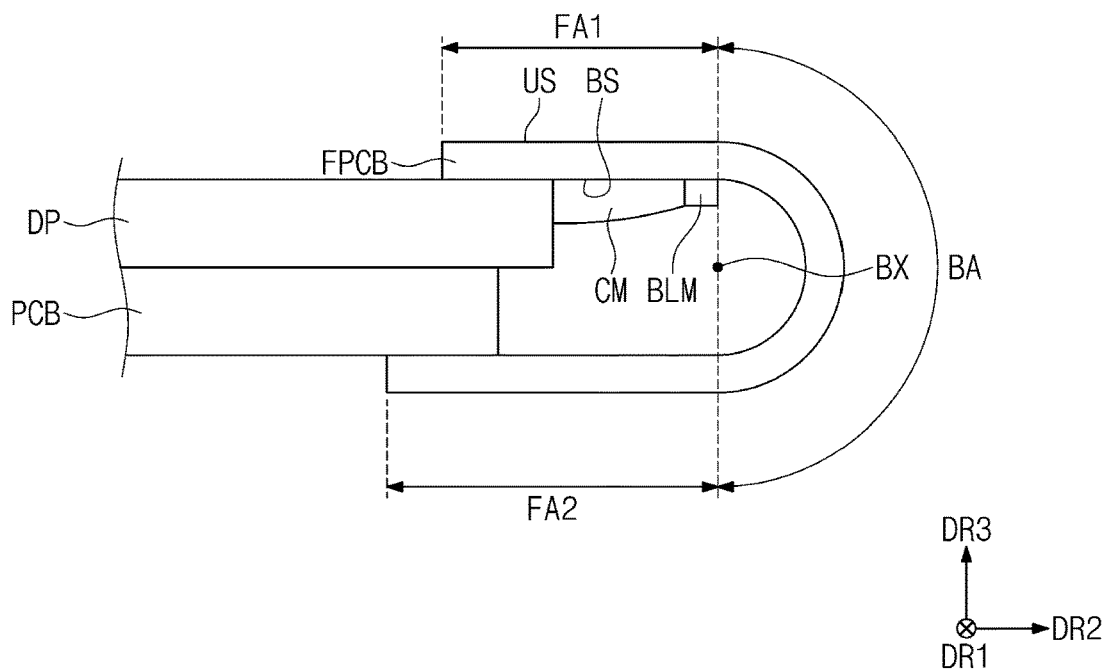
FIGS. 8 to 13 are cross-sectional views illustrating bent flexible boards according to some embodiments of the present disclosure.

FIG. 5 is a perspective view illustrating a display module and a printed circuit board according to an embodiment of the present disclosure, FIG. 6 is a cross-sectional view illustrating a display module and a printed circuit board according to an embodiment of the present disclosure, FIG. 7 is a plan view illustrating a flexible board according to an embodiment of the present disclosure, and FIG. 8 is a cross-sectional view illustrating a bent flexible board according to an embodiment of the present disclosure.

Referring to FIGS. 5 to 8, a plurality of areas may be defined in the flexible board FPS according to an embodiment of the present disclosure. For example, a first flat area FA1, a bending area BA, and a second flat area FA2 may be defined in the flexible board FPS. The first flat area FA1, the bending area BA, and the second flat area FA2 may be sequentially arranged in the second direction DR2 (e.g., when the bending area BA is not bent).

The first flat area FA1 may be defined in one side area of the flexible board FPS in the second direction DR2. In the present embodiment, the first flat area FA1 of the flexible board FPS may be connected directly to the display panel DP. At least a portion of the first flat area FA1 may be connected directly to the display panel DP. At least a portion of the first flat area FA1 may be bonded to the panel pad area BAD (see FIG. 3) described above.

The second flat area FA2 may be defined in another side area of the flexible board FPS in the second direction DR2. In the present embodiment, the second flat area FA2 of the flexible board FPS may be connected directly to the printed circuit board PCB. At least a portion of the second flat area FA2 may be connected directly to the printed circuit board PCB. The second flat area FA2 may be bonded to the board pad area BAP (see FIG. 3) described above.

The bending area BA may be located between the first flat area FA1 and the second flat area FA2 to connect the first flat area FA1 and the second flat area FA2. The bending area BA may have bending characteristics. The printed circuit board PCB electrically connected to the display panel DP through the flexible board FPS may be located under the display panel DP, and thus the bending area BA of the flexible board FPS may be bent.

Referring to FIGS. 6 and 8, the flexible board FPS according to an embodiment of the present disclosure may include a base substrate FPCB, a cover member CM, and a blocking member BLM.

The base substrate FPCB may correspond to a body portion of the flexible board FPS, and may be connected to the display panel DP. Even though not shown in the drawings, the base substrate FPCB may include a plurality of signal lines. The base substrate FPCB may be connected to the display panel DP, and the display panel DP and the base substrate FPCB may be electrically connected to each other through the plurality of signal lines included in the base substrate FPCB.

A bottom surface BS of the base substrate FPCB may be defined as a surface adjacent a bending axis BX about which the bending area BA is bent. An upper surface, or top surface US, of the base substrate FPCB may be defined as a surface that is opposite to the bottom surface BS and that is farther from the bending axis BX than the bottom surface BS.

The cover member CM may cover a boundary at which the display panel DP and the base substrate FPCB are connected to each other. The cover member CM may be in contact with a side surface connecting a display surface and a rear surface of the display panel DP. The cover member CM may include a material for preventing permeation of moisture and oxygen. In an embodiment, the cover member CM may include a waterproof resin.

The blocking member BLM may be in contact with the cover member CM, and may determine a position of the cover member CM in such a way that the cover member CM is not located in the bending area BA. In other words, when the cover member CM is formed, the blocking member BLM may allow the cover member CM to be formed in only the first flat area FA1 without being formed in the bending area BA. The blocking member BLM and the cover member CM may be located in the first flat area FA1, and may not overlap with the bending area BA when viewed in a plan view. The blocking member BLM may include a silicon (Si)-based material.

In a flexible circuit board connected to a display module of a display device, a cover member may be located at a boundary of the display module and the flexible circuit board to reduce or prevent permeation of moisture and oxygen into a connecting portion of the flexible circuit board and the display module, and to reduce or prevent the likelihood of an occurrence of a crack. However, if the cover member formed of a resin is formed in a relatively wide area, a bending defect may occur in bending the flexible circuit board. However, in the display device according to embodiments of the present disclosure, the cover member CM may not be formed in an excessively wide area, but instead may be located in only a partial area of the flexible board FPS, due to the blocking member BLM determining the position of the cover member CM. Thus, a bending defect may be avoided, and an area in which the cover member CM is located may be reduced to reduce a dead space of the display device.

FIGS. 9 to 12 are cross-sectional views illustrating bent flexible boards according to other embodiments of the present disclosure. In the embodiments of FIGS. 9 to 12, the same components as those in the embodiment of FIG. 8 will be indicated by the same respective reference designators, and the descriptions thereto will be omitted.

Figure 9:
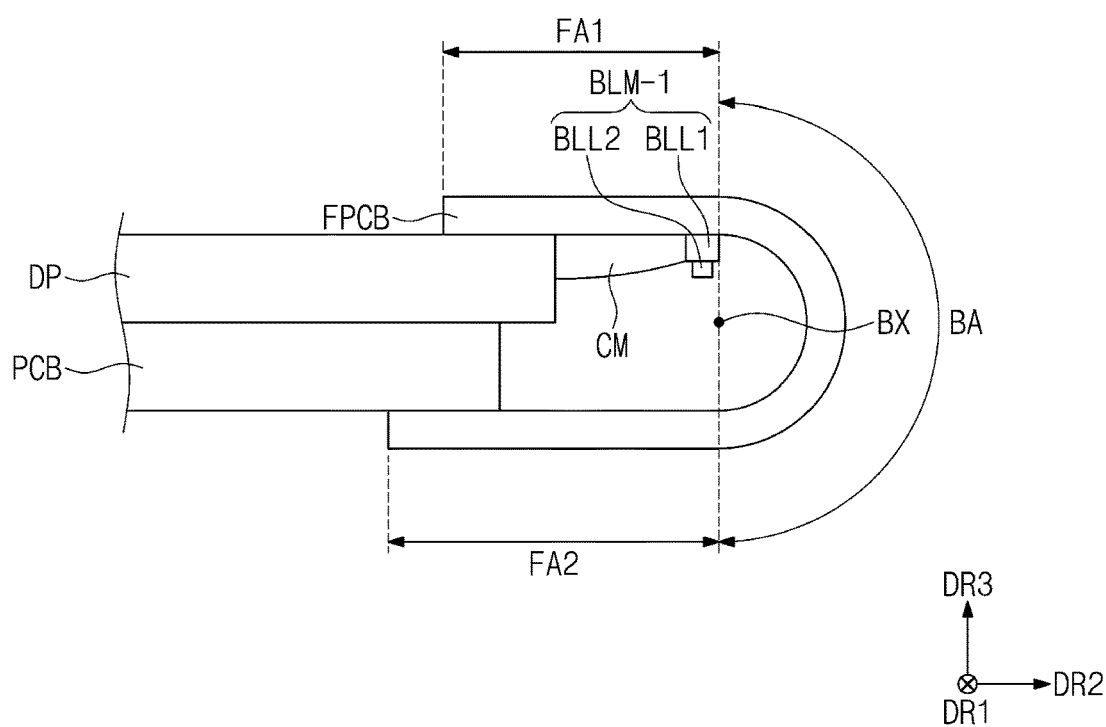

Referring to FIG. 9, in a display device according to an embodiment of the present disclosure, a blocking member BLM-1 may include a plurality of layers. The blocking member BLM-1 may include a first blocking layer BLL1 and a second blocking layer BLL2. The first blocking layer BLL1 and the second blocking layer BLL2 may include the same material. A planar area of the first blocking layer BLL1 may be greater than a planar area of the second blocking layer BLL2. In other words, the blocking member BLM-1 may have a stepped structure including layers of which areas decrease sequentially toward one direction. The blocking member BLM-1 having two layers is illustrated as an example in FIG. 9. However, embodiments of the present disclosure are not limited thereto. In certain embodiments, the blocking member BLM-1 may include three or more blocking layers.

Figure 10:
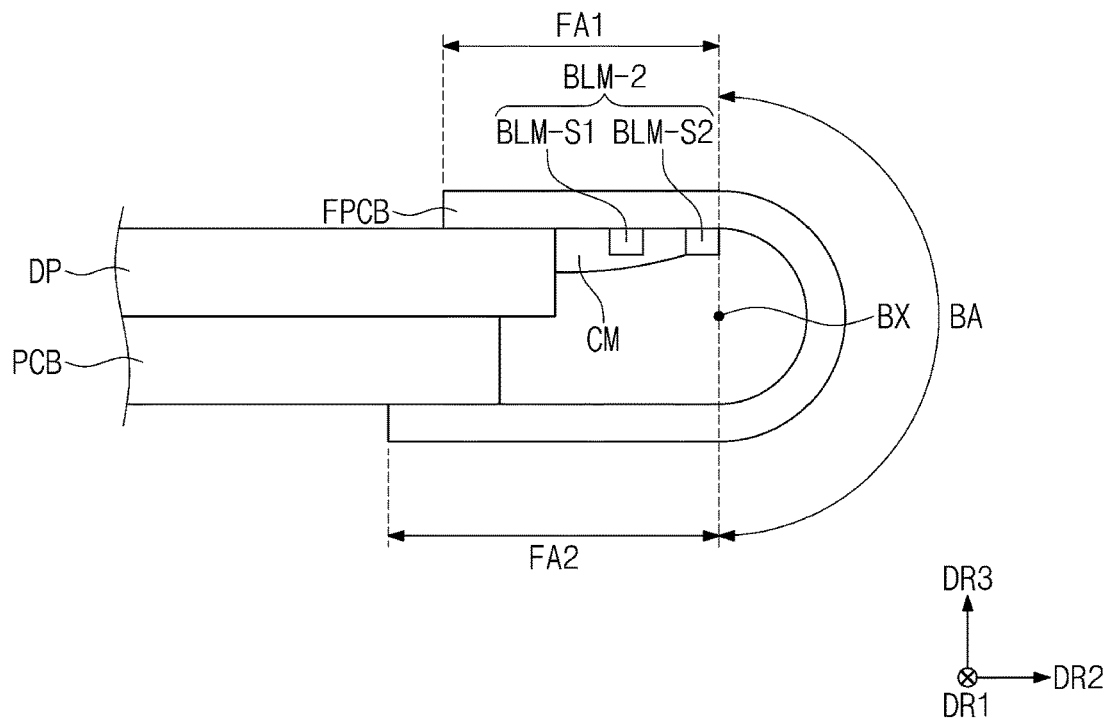

Referring to FIG. 10, in a display device according to an embodiment of the present disclosure, a blocking member BLM-2 may include a plurality of sub-blocking members spaced apart from each other in the second direction DR2. The blocking member BLM-2 may include a first sub-blocking member BLM-S1 and a second sub-blocking member BLM-S2, which are spaced apart from each other in the second direction DR2. The cover member CM may fill a space formed between the first sub-blocking member BLM-S1 and the second sub-blocking member BLM-S2. The cover member CM may fill the space between the first and second sub-blocking members BLM-S1 and BLM-S2, and may be in contact with a side surface of the second sub-blocking member BLM-S2, and thus the cover member CM may be located at a position substantially determined by the second sub-blocking member BLM-S2.

The first sub-blocking member BLM-S1 and the second sub-blocking member BLM-S2 may include the same material. The first and second sub-blocking members BLM-S1 and BLM-S2 have the same sectional shape in FIG. 10. However, embodiments of the present disclosure are not limited thereto. In another embodiment, the first and second sub-blocking members BLM-S1 and BLM-S2 may have different shapes. In an embodiment, a height of the second sub-blocking member BLM-S2 (e.g., a thickness in the third direction DR3) may be greater than a height of the first sub-blocking member BLM-S1.

Figure 11:
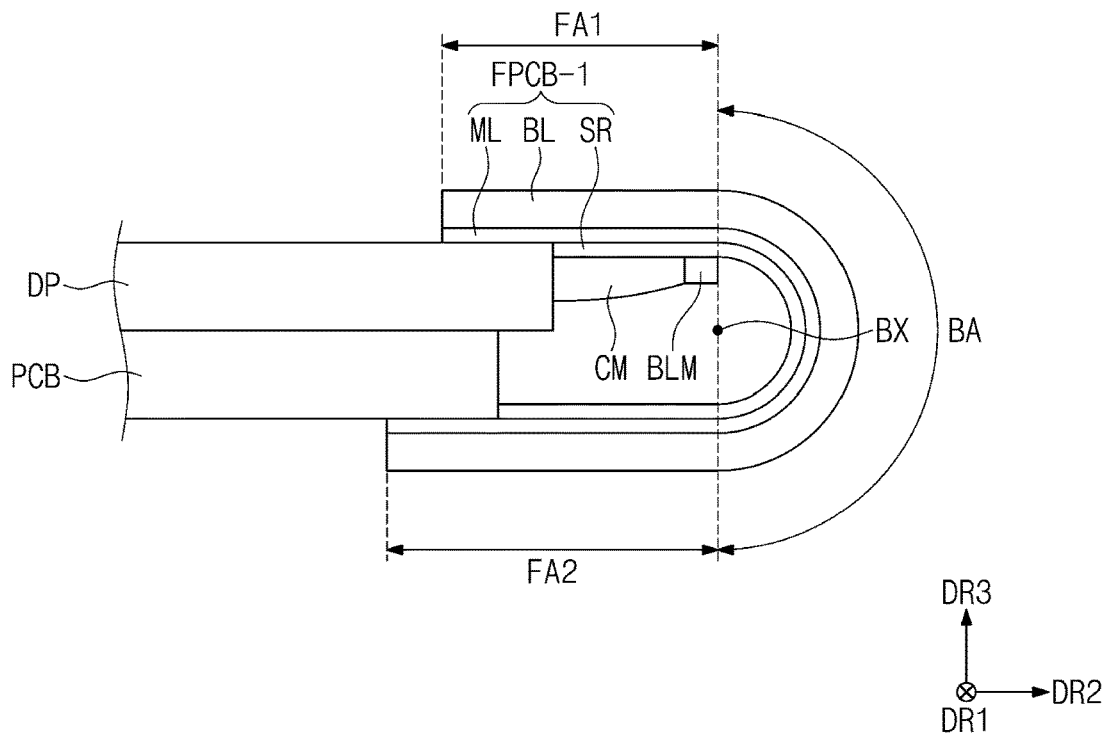

Referring to FIG. 11, in a display device according to an embodiment of the present disclosure, a base substrate FPCB-1 may include a base layer BL, a circuit layer ML, and a solder resist layer SR.

The base layer BL may include a flexible material having bending characteristics. An insulating film having flexibility and rigidity may be used as the base layer BL. For example, the base layer BL may be a polyimide (PI) layer.

The circuit layer ML may be a layer including the plurality of signal lines described above. The circuit layer ML may be connected to the display panel DP, and may be electrically connected to the display panel DP through the plurality of signal lines included in the circuit layer ML.

The solder resist layer SR may be located on the circuit layer ML. The solder resist layer SR may be located on the circuit layer ML, and may not overlap with the display panel DP and the printed circuit board PCB in a plan view. The solder resist layer SR may include an insulating resin. The solder resist layer SR may reduce or prevent the likelihood of a conductive foreign material adhering to the circuit layer ML, and may reduce or prevent the likelihood of a short occurring at the circuit layer ML.

The cover member CM and the blocking member BLM may be located on the solder resist layer SR. The blocking member BLM may include the same material as the solder resist layer SR. In an embodiment, when the blocking member BLM is formed, one layer may be formed using the same material as the solder resist layer SR, and then, the one layer may be patterned to form the blocking member BLM.

Figure 12:
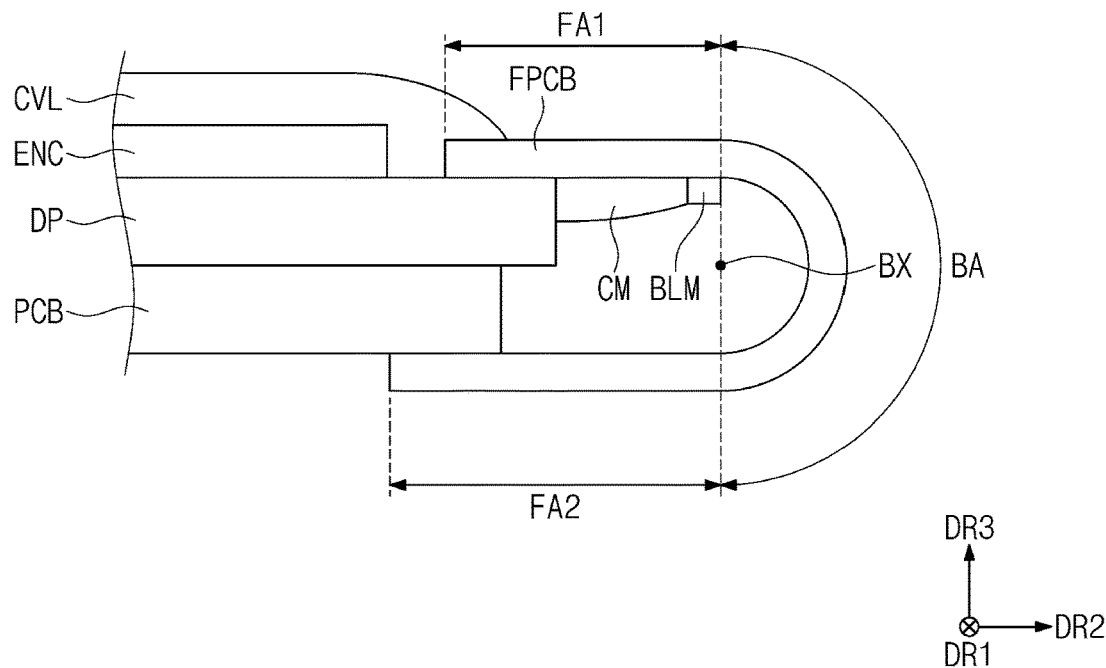

Referring to FIG. 12, in a display device according to an embodiment of the present disclosure, a plurality of display elements (e.g., OLED of FIG. 4) that are configured to display an image may be located on the display panel DP, and an encapsulation layer ENC may be located to cover the plurality of display elements OLED. The encapsulation layer ENC may be a glass substrate, a quartz substrate, or a transparent resin substrate. A sealing member for bonding the encapsulation layer ENC to the display panel DP may be located between the encapsulation layer ENC and the display panel DP. Alternatively, the encapsulation layer ENC may have a single-layered or multi-layered structure including at least one of an organic layer or an inorganic layer. In an embodiment, the encapsulation layer ENC may have a structure in which at least one inorganic layer and at least one organic layer are alternately stacked. In the present embodiment, the inorganic layer may block external oxygen and moisture, and the organic layer may planarize a step difference generated by a pixel defining layer. In the present embodiment, the inorganic layer may be located at an uppermost portion of the encapsulation layer ENC.

The display device according to an embodiment of the present disclosure may further include a cover layer CVL, which is in contact with the top surface US of the base substrate FPCB. The cover layer CVL may cover a step difference generated by the connection of the base substrate FPCB and the display panel DP, and may reduce or prevent permeation of moisture and oxygen through a connecting portion of the base substrate FPCB and the display panel DP. The cover layer CVL may be in contact with an exposed top surface of the display panel DP, and may be located on the encapsulation layer ENC.

Figure 13:
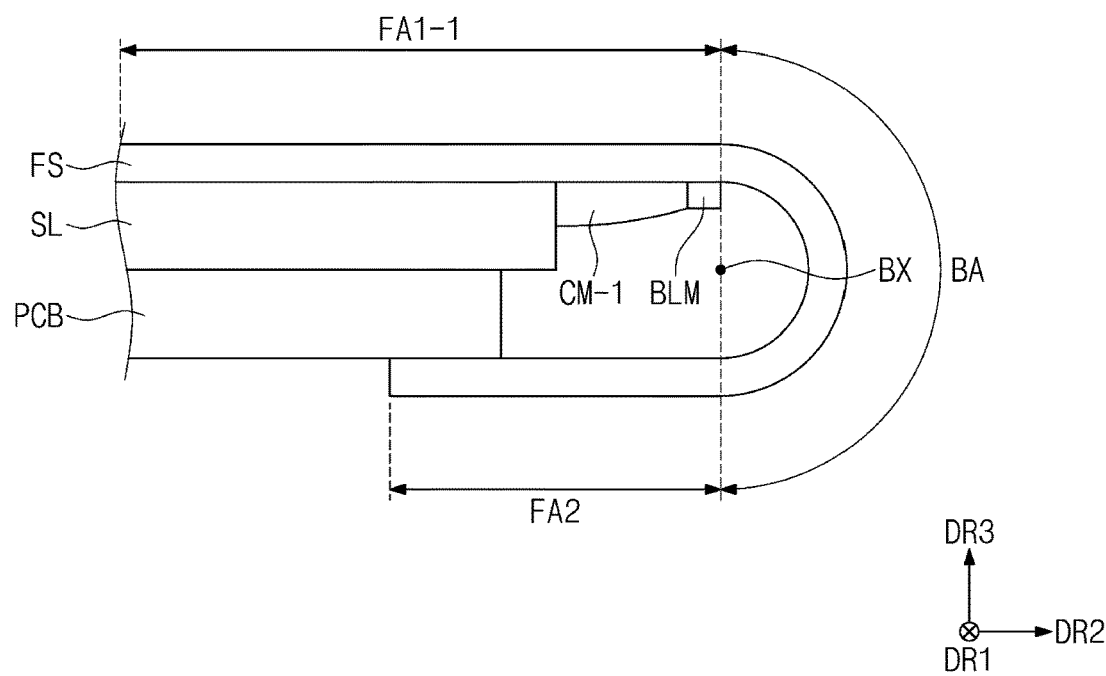

FIG. 13 is a cross-sectional view illustrating a bent flexible board according to yet another embodiment of the present disclosure. In the embodiment of FIG. 13, the same components as in the above embodiment of FIG. 8 will be indicated by the same respective reference designators, and the descriptions thereto will be omitted.

Referring to FIG. 13, a display device according to an embodiment of the present disclosure may not include a separate flexible board, but instead may include a flexible display substrate (or a flexible display module) FS. A portion of the flexible display substrate FS may be bent. The flexible display substrate FS may correspond to the display panel DP of FIG. 5, and thus may include a display area (e.g., see DA of FIG. 5) and a non-display area (e.g., see NDA of FIG. 5). The non-display area of the flexible display substrate FS may include a first flat area FA1-1, a bending area BA, and a second flat area FA2. The printed circuit board PCB may be connected to the second flat area FA2, and the flexible display substrate FS may be bent to allow the printed circuit board PCB to be located under the flexible display substrate FS (e.g., under the first flat area FA1-1 of the flexible display substrate FS).

The flexible display substrate FS may have a display surface for displaying an image, and a rear surface that is opposite to the display surface. A support layer SL may be located on the rear surface of the flexible display substrate FS. The support layer SL may support the flexible display substrate FS to maintain shapes of the flat area(s) of the flexible display substrate FS (e.g., of the first flat area FA1-1).

A cover member CM-1 and a blocking member BLM may be located on the rear surface of the flexible display substrate FS. The cover member CM-1 and the blocking member BLM may overlap with the first flat area FA1-1 of the flexible display substrate FS, but may not overlap with the bending area BA of the flexible display substrate FS. The cover member CM-1 may reduce or prevent permeation of moisture and/or oxygen into a boundary at which the flexible display substrate FS and the support layer SL are bonded to each other, and may reduce or prevent a likelihood of a crack occurring at a bonded portion of the flexible display substrate FS and the support layer SL. When the cover member CM-1 is formed, the blocking member BLM may determine a position of the cover member CM-1 in such a way that the cover member CM-1 does not extend onto the bending area BA but is located on only the first flat area FA1-1.

A method of manufacturing a display device according to an embodiment of the present disclosure will be described hereinafter with reference to the drawings.

Figure 14A:
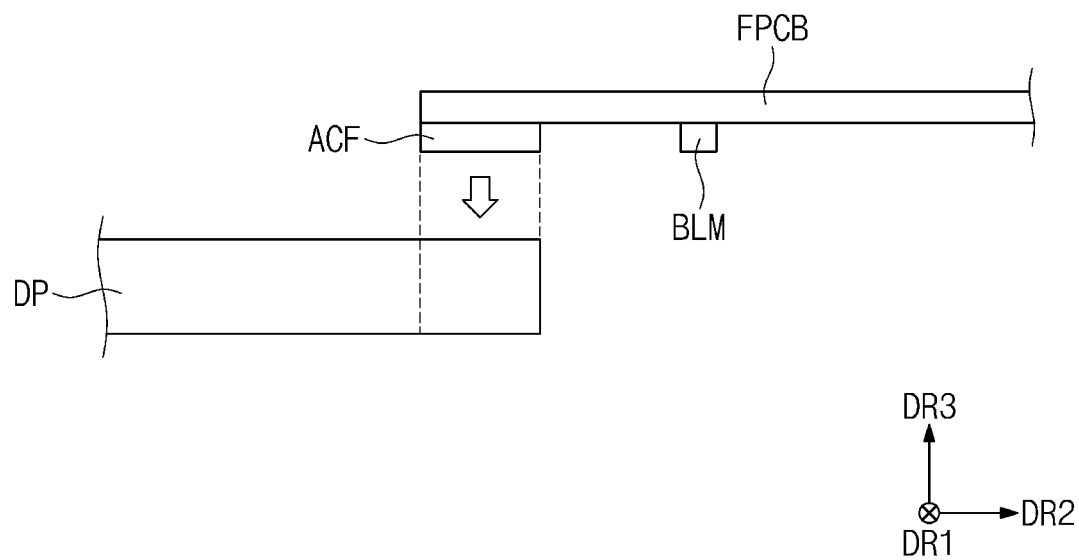
FIGS. 14A to 14C are cross-sectional views illustrating some processes of a method of manufacturing a display device according to an embodiment of the present disclosure.
Figure 14B:
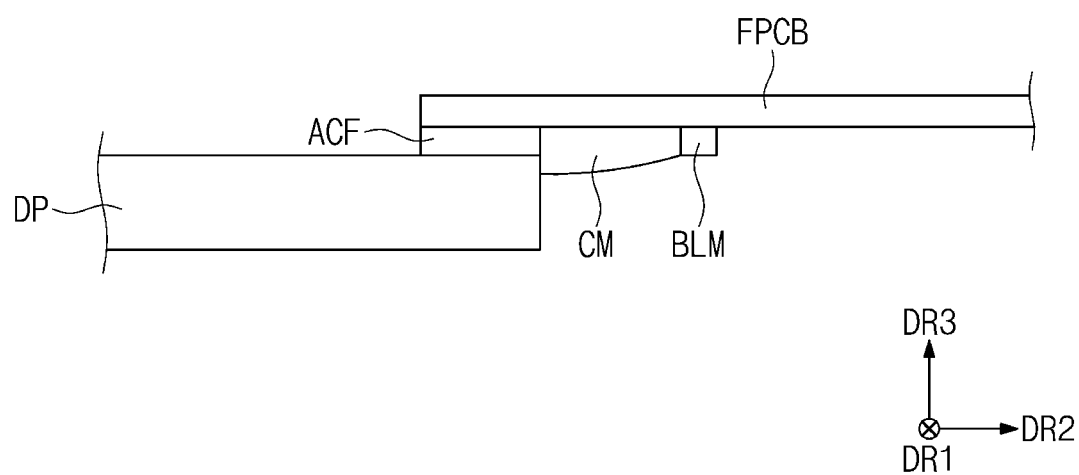
Figure 14C:
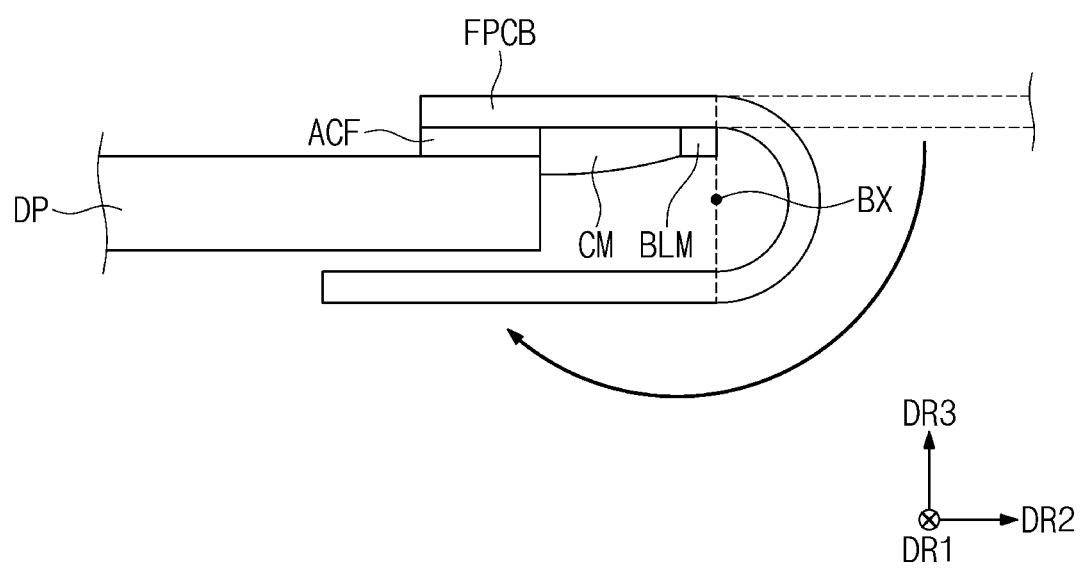

FIGS. 14A to 14C are cross-sectional views illustrating some processes of a method of manufacturing a display device according to an embodiment of the present disclosure. FIGS. 14A to 14C mainly illustrate a process of connecting a flexible board to a display module, and a process of bending the flexible board, in a method of manufacturing a display device according to an embodiment of the present disclosure. Hereinafter, the same components as described above will be indicated by the same respective reference designators, and repeated descriptions thereto will be omitted.

A method of manufacturing a display device according to an embodiment of the present disclosure may include preparing a display module that is configured to display an image, preparing a flexible board, bonding an end of the flexible board to one edge portion of the display module, forming a cover member for covering a side surface of the one edge portion of the display module connected to the flexible board, and bending the flexible board.

Referring to FIG. 14A, in the bonding of the display module and the flexible board, a display panel DP and a base substrate FPCB may be bonded to each other. In the method of manufacturing a display device according to an embodiment of the present disclosure, an end of the base substrate FPCB may be bonded to one edge portion of the display panel DP.

The preparing of the flexible board may include forming a blocking member BLM (e.g., a blocking member BLM having a predetermined height) on the base substrate FPCB. The blocking member BLM may be formed to be located on a flat area that is not bent during the bending of the flexible board.

In the bonding of the display panel DP and the base substrate FPCB, a conductive adhesive layer ACF may be formed for the bonding. The conductive adhesive layer ACF may include a conductive material to electrically connect the display panel DP and the base substrate FPCB. For example, the conductive adhesive layer ACF may include an adhesive film and conductive particles (e.g., metal particles) dispersed in the adhesive film.

Referring to FIG. 14B, after the display panel DP and the base substrate FPCB are bonded to each other, the cover member CM may be formed in an area defined between a side surface of the display panel DP and the blocking member BLM. The cover member CM may be formed to cover at least a portion of the side surface of the display panel DP.

A waterproof resin may be applied to reduce or prevent permeation of oxygen and moisture into a bonded portion of the display panel DP and the base substrate FPCB, and then, the waterproof resin may be hardened to form the cover member CM. Due to the blocking member BLM previously formed on the flat area in the preparing of the flexible board, the cover member CM may not overflow to the bending area, but instead may be formed on only the flat area.

Referring to FIG. 14C, the base substrate FPCB may be bent after the formation of the cover member CM. The base substrate FPCB may be bent about a bending axis BX, and thus at least a portion of the base substrate FPCB may be located under the display panel DP. The bending axis BX may be defined adjacent a rear surface (or a bottom surface)

of the base substrate FPCB, the rear surface being a surface on which the blocking member BLM and the cover member CM are formed. In FIG. 14C, another component is not connected to another end of the base substrate FPCB. However, embodiments of the present disclosure are not limited thereto. For example, the printed circuit board PCB (see FIG. 8) may be connected to the other end of the base substrate FPCB.

In the method of manufacturing a display device according to the present embodiment, the cover member CM may be prevented from flowing onto the bending area by the previously formed blocking member BLM prior to the bending of the flexible board about the bending axis. Thus, it is possible to prevent moisture and oxygen from permeating into the display module, and a bending defect of the display device may be avoided because the cover member is not formed on the bending area.

According to embodiments of the present disclosure, the cover member may be formed at the boundary between the flexible board and the display module to improve damp-proof or waterproof properties. In addition, the cover member may not permeate to the bending area of the flexible board, and thus the bending characteristics of the flexible board may be effectively maintained.

While embodiments of the present disclosure have been described with reference to example embodiments, it will be apparent to those skilled in the art that various changes and modifications may be made without departing from the spirits and scopes of the disclosed embodiments. Therefore, it should be understood that the above embodiments are not limiting, but illustrative. Thus, the scopes of the embodiments are to be determined by the broadest permissible interpretation of the following claims and their equivalents, and shall not be restricted or limited by the foregoing description.

What is claimed is:

1. A display device comprising:
   a display module configured to display an image; and
   a flexible board in which a flat area and a bending area arranged in one direction in a plan view are defined,
   wherein at least a portion of the flat area is connected to the display module, and
   wherein the flexible board comprises:
      a base substrate connected to the display module;
      a cover member on the flat area, and covering a boundary at which the base substrate and the display module are connected to each other; and
      a blocking member on the flat area, and in contact with the cover member,
   wherein the cover member is at least partially between the blocking member and a display area of the display module in the plan view.

2. The display device of claim 1, wherein the bending area is bent about a bending axis,
   wherein the flexible board comprises: a bottom surface adjacent the bending axis; and a top surface opposite to the bottom surface, and
   wherein the cover member and the blocking member are on the bottom surface of the flexible board.

3. The display device of claim 2, further comprising a cover layer contacting the display module and the top surface of the flexible board.

4. The display device of claim 3, wherein the display module comprises: a plurality of display elements configured to generate light for displaying the image; and an encapsulation layer covering the plurality of display elements,
wherein the cover layer is in contact with at least a portion of the encapsulation layer.

5. The display device of claim 1, wherein the blocking member comprises: a first blocking layer on the base substrate; and a second blocking layer on the first blocking layer.

6. The display device of claim 1, wherein the blocking member comprises a first sub-blocking member and a second sub-blocking member, which are spaced apart from each other in the one direction, and
   wherein the cover member fills a space between the first sub-blocking member and the second sub-blocking member.

7. The display device of claim 1, further comprising a printed circuit board under the display module,
   wherein a first flat area, the bending area, and a second flat area arranged in the one direction in a plan view are defined in the flexible board,
   wherein the flexible board is connected to the display module at the first flat area, and
   wherein the flexible board is connected to the printed circuit board at the second flat area.

8. The display device of claim 1, wherein the blocking member overlaps with the flat area, and does not overlap with the bending area, when viewed in a plan view.

9. The display device of claim 1, wherein the base substrate comprises:
   a base layer;
   a circuit layer on the base layer and connected to the display module; and
   a solder resist layer on the circuit layer, and
   wherein the blocking member is on the solder resist layer.

10. The display device of claim 9, wherein the blocking member comprises the same material as the solder resist layer.

11. The display device of claim 1, further comprising a driving element on at least one of the flexible board or the display module.

12. The display device of claim 1, wherein the display module comprises: a display surface for displaying the image; a rear surface opposite to the display surface; and one side surface connecting the display surface and the rear surface, and
   wherein the cover member is in contact with the one side surface.

13. A display device comprising:
   a flexible display module in which a display area for displaying an image, and a non-display area adjacent the display area, are defined;
   a cover member that is in the non-display area, and that does not overlap with the display area, in a plan view; and
   a blocking member in the non-display area, and in contact with the cover member,
   wherein the flexible display module comprises:
      a display surface for displaying the image; and
      a rear surface opposite to the display surface, and
   wherein the cover member and the blocking member are on the rear surface of the flexible display module, and
   wherein the cover member is at least partially between the blocking member and the display area of the flexible display module in the plan view.

14. The display device of claim 13, wherein the non-display area comprises: a flat area adjacent the display area; and a bending area spaced apart from the display area with the flat area interposed therebetween, and bent about a bending axis adjacent the rear surface of the flexible display module, and
    wherein the cover member and the blocking member are on the flat area, and do not overlap with the bending area, when viewed in a plan view.

15. The display device of claim 13, further comprising a support layer on the rear surface of the flexible display module,
    wherein the cover member is in contact with the rear surface of the flexible display module and a side surface of the support layer.

16. The display device of claim 13, further comprising a printed circuit board under the flexible display module,
    wherein the cover member and the blocking member are spaced apart from the printed circuit board.

17. The display device of claim 16, wherein the non-display area comprises a first flat area, a bending area, and a second flat area, which are arranged in one direction in a plan view,
    wherein the cover member and the blocking member are on the first flat area, and
    wherein the second flat area is connected to the printed circuit board.

18. A method of manufacturing a display device, the method comprising:
    preparing a display module configured to display an image;
    preparing a flexible board in which a blocking member is formed on a base substrate;
    bonding an end of the flexible board to one edge portion of the display module;
    forming a cover member contacting a side surface of the one edge portion of the display module connected to the flexible board; and
    bending the flexible board,
    wherein the cover member is formed in an area between the blocking member and the side surface of the one edge portion of a display area of the display module in a plan view.

19. The method of claim 18, wherein a bending axis is adjacent a surface of the base substrate on which the blocking member is formed, and
    wherein the flexible board is bent about the bending axis in the bending of the flexible board.

20. The method of claim 19, wherein the flexible board comprises: a bending area bent about the bending axis; and a flat area adjacent the bending area, and
    wherein the blocking member and the cover member are on the flat area.

\* \* \* \* \*